US009214492B2

(12) United States Patent
Van Der Tempel et al.

(10) Patent No.: US 9,214,492 B2
(45) Date of Patent: Dec. 15, 2015

(54) MULTISPECTRAL SENSOR

(71) Applicant: SOFTKINETIC SENSORS NV, Brussels (BE)

(72) Inventors: Ward Van Der Tempel, Keerbergen (BE); Daniel Van Nieuwenhove, Brussels (BE); Maarten Kuijk, Antwerp (BE)

(73) Assignee: Softkinetic Sensors N.V., Brussels (BE)

( * ) Notice: Subject to any disclaimer, the term of this patent is extended or adjusted under 35 U.S.C. 154(b) by 0 days.

(21) Appl. No.: 14/371,326

(22) PCT Filed: Jan. 10, 2013

(86) PCT No.: PCT/EP2013/050409
§ 371 (c)(1),
(2) Date: Jul. 9, 2014

(87) PCT Pub. No.: WO2013/104718
PCT Pub. Date: Jul. 18, 2013

(65) Prior Publication Data
US 2015/0001664 A1     Jan. 1, 2015

(30) Foreign Application Priority Data

Jan. 10, 2012 (EP) .................................... 12150688

(51) Int. Cl.
| *H01L 27/148* | (2006.01) |
|---|---|
| *H01L 27/146* | (2006.01) |
| *G01S 17/89* | (2006.01) |
| *G01S 7/491* | (2006.01) |
| *G01J 3/28* | (2006.01) |

(52) U.S. Cl.
CPC ......... *H01L 27/14645* (2013.01); *G01S 7/4914* (2013.01); *G01S 17/89* (2013.01); *H01L 27/14612* (2013.01); *H01L 27/14621* (2013.01); *H01L 27/14643* (2013.01); *G01J 2003/2826* (2013.01); *H01L 27/14623* (2013.01)

(58) Field of Classification Search
None
See application file for complete search history.

(56) References Cited

U.S. PATENT DOCUMENTS

| 7,427,734 | B2* | 9/2008 | Yang et al. ................. 250/208.1 |
|---|---|---|---|
| 8,605,199 | B2* | 12/2013 | Imai .............................. 348/342 |
| 8,619,179 | B2* | 12/2013 | Imai .............................. 348/342 |
| 8,654,210 | B2* | 2/2014 | Imai et al. .................. 348/230.1 |
| 8,717,457 | B2* | 5/2014 | Lin et al. ..................... 348/222.1 |
| 8,760,561 | B2* | 6/2014 | Haikin et al. ................. 348/342 |
| 8,760,638 | B2* | 6/2014 | Imai et al. ....................... 356/73 |
| 8,836,808 | B2* | 9/2014 | Imai .......................... 348/222.1 |
| 9,060,110 | B2* | 6/2015 | Imai .................................... 1/1 |
| 2005/0051730 | A1* | 3/2005 | Kuijk et al. ............. 250/370.01 |

(Continued)

OTHER PUBLICATIONS

Danil Van Nieuwenhove et al: "Photonic Demodulator With Sensitivity Control", IEEE Sensors Journal, IEEE Service Center, New York, NY, US, vol. 7, No. 3, Mar. 1, 2007, pp. 317-318, XP011161742, ISSN: 1530-437X.

*Primary Examiner* — David E Graybill
(74) *Attorney, Agent, or Firm* — Duane Morris LLP; J. Rodman Steele, Jr.; Gregory M. Lefkowitz

(57) ABSTRACT

The present invention relates to a color and non-visible light e.g. IR sensor, namely a multispectral sensor which can be used in a camera such as a TOF camera for depth measurement, reflectance measurement and color measurement, and for generation of 3D image data or 3D images as well as the camera itself and methods of operating the same.

13 Claims, 8 Drawing Sheets

(56) References Cited

U.S. PATENT DOCUMENTS

| | | | |
|---|---|---|---|
| 2007/0084986 A1* | 4/2007 | Yang et al. | 250/208.1 |
| 2008/0191298 A1* | 8/2008 | Lin et al. | 257/432 |
| 2011/0063614 A1* | 3/2011 | Van Niewenhove et al. | 356/326 |
| 2011/0074989 A1* | 3/2011 | Fossum et al. | 348/273 |
| 2011/0255071 A1* | 10/2011 | Van Der Tempel et al. | 356/5.01 |
| 2012/0127301 A1* | 5/2012 | Imai | 348/135 |
| 2012/0212636 A1* | 8/2012 | Haikin et al. | 348/222.1 |
| 2012/0213407 A1* | 8/2012 | Haikin et al. | 382/103 |
| 2012/0249819 A1* | 10/2012 | Imai | 348/222.1 |
| 2012/0249821 A1* | 10/2012 | Imai | 348/222.1 |
| 2012/0268618 A1* | 10/2012 | Imai | 348/222.1 |
| 2013/0002928 A1* | 1/2013 | Imai | 348/333.11 |
| 2013/0088612 A1* | 4/2013 | Imai | 348/222.1 |
| 2013/0093919 A1* | 4/2013 | Imai et al. | 348/229.1 |
| 2014/0049662 A1* | 2/2014 | Lin et al. | 348/222.1 |
| 2014/0049779 A1* | 2/2014 | Tin et al. | 356/456 |
| 2014/0055775 A1* | 2/2014 | Imai et al. | 356/73 |
| 2015/0001664 A1* | 1/2015 | Van Der Tempel et al. | 257/432 |

* cited by examiner

| I B | Q G | I B | Q G | Q G |
|-----|-----|-----|-----|-----|
| Q G | I R | Q G | I R | I R |
| I B | Q G | I B | Q G | Q G |
| Q G | I R | Q G | I R | I R |
| I B | Q G | I B | Q G | Q G |

Fig 1c

| Q B | I G | Q G | Q G | I B |
|-----|-----|-----|-----|-----|
| I G | Q R | I R | I R | Q G |
| Q B | I G | Q G | Q G | I B |
| I G | Q R | I R | I R | Q G |
| Q B | I G | Q G | Q G | I B |

Fig 1d

MULTISPECTRAL SENSOR

CROSS-REFERENCE TO RELATED APPLICATIONS

This application is a §371 national stage entry of International Application No. PCT/EP2013/050409, filed Jan. 10, 2013, which claims priority to European Patent Application No. 12150688.5 filed Jan. 10, 2012, the entire contents of which are incorporated herein by reference.

The present invention relates to a color and non-visible light e.g. IR sensor, namely a multispectral sensor which can be used in a camera such as a TOF camera for depth measurement, reflectance measurement and color measurement, and for generation of 3D image data or 3D images as well as the camera itself and methods of operating the same.

TECHNICAL BACKGROUND

A camera has a plane receiving surface and based on this surface a co-ordinate system can be defined in which x, y is in the plane of that surface of the camera and z is an axis along the optical path of the camera. Time-of-Flight imaging systems measure the time difference or phase difference between pulsed light emitted from LED's or lasers, e.g. laser diodes, and the reflected pulses. In 3D Time-of-Flight imaging systems, a crucial functionality is to provide not only z data (z being the measured depth map) of the scene in the field of view of the camera, but also IR illumination and color data of the viewed scene and even to provide an image of the scene itself, e.g. in a 3D form embedding at least some color components and the depth values. To do so, one can use two cameras. Another implementation option is to have two sets of pixels array (two sensors) in one single camera. In either way, such color data is then build by a system with 2 separate sensors and lens systems. On top of the increased bill of materials, this approach requires a careful calibration and intensive calculations to map the pixels color data on the depth data and vice-versa. The so called image registration process is because the 2 imaging systems do not include necessarily lens having the same optical properties and because they may also not include the same resolution, and because they also are not necessarily well aligned.

US20110074989 provides a way to combine R, G or B pixels with depth-measuring pixels without taking into account the need for optimization of the depth-measuring active region, nor optimization of spatial aliasing that may occurs from the depthsensing pixels spatial arrangement. Additionally, the RGBZ image is created by interpolating the Z pixels on the RGB pixels which is prone to registration errors.

SUMMARY OF THE INVENTION

An object of the present invention is to provide an alternative non-visible light, e.g. IR and color sensor, namely a multispectral sensor which can be used in a camera such as a TOF camera to provide at least 3D data as well as, in an even more preferred embodiment, color data, and additional data that is related to a distance dependent factor such as non-visible light reflectance, e.g. IR reflectance data measurements, the camera itself as well as methods of operating the same.

An advantage of embodiments of the present invention is that it can provide at least a color/depth map by combining at least 2 functionalities (i.e. color image and distance image measurements) and preferably 3 functionalities (i.e. color/depth/a distance dependent factor such as a reflectance measurement) in one single sensor. In a preferred embodiment, it also can also provide a map that is based on the distance dependent factor such as a non-visible light, e.g. IR reflectance map corresponding to the amount of non-visible light, e.g. IR light reflected by object in the scene during a predetermined sensing integration time. Embodiments of the present invention offer an optimal way to combine both functionalities with a minimum loss of performance. Another advantage of embodiments of the present invention is to maximize the optically active part of the pixel in particular the depth-measuring region. A further advantage of embodiments of the present invention is to create the color/depth 3D image (e.g. RGBZ image) without the need for interpolating the Z pixels spatially, i.e. on the color pixels e.g. RGB pixels which hence avoids registration nor spatial aliasing errors. Spatial aliazing can occur when the color pixels are at a different location than the non-visible light, e.g. IR pixels. In such as situation interpolation may be necessary to compensate for the distance between the different locations.

Embodiments of the present invention provide a color or multispectral image sensor device, the image sensor device comprising a pixel sensor associated with a single pixel of an image, wherein the pixel sensor comprises:
  a substrate in which charge carriers are generatable in response to light incident on the substrate,
  first and second contact elements for electrically contacting the pixel sensor, wherein the first and second contact elements are arranged adjacent to one another,
  a first detection element (314, 404,504, 604) configured for detecting generated charge carriers in a first detection region,
  a means for controlling the detectivity of the first detection region (301)
  a second detection element (316,401,500,600) configured for detecting generated charge carriers in a second detection region,
  a first filter element configured for letting pass light of a first wavelength range, wherein the first filter element overlaps a portion of the substrate comprising the first and second contact elements, and
  a second filter element configured for letting pass light of a second wavelength range, wherein the second filter element overlaps a portion of the substrate comprising the second detection element, wherein the second wavelength range is different from the first wavelength range and is associated with a colour or wavelength range.

Embodiments of the present invention provide a 3D image sensor having the color or multispectral image sensor device according to the invention, the 3D image sensor device comprising a plurality of the pixel sensors, wherein each pixel sensor of the plurality of pixel sensors is associated with a single pixel.

Embodiments of the present invention provide a camera comprising image sensor devices according to embodiments of the invention and:
  a color computation unit connected to a first set of detection elements, the output of which is a color value,
  an IR computation unit the output of which is:
    a depth measurement
    a scene illumination measurement e.g. a confidence map)

In accordance with an aspect of the present invention each single pixel has embedded within it both a non-visible light e.g. IR and a color sensing area. The spatial registration of these two different pixels is near perfect, and no interpolation is required.

The sensor can include an array of sensing units (i.e. a pixel array), where each individual sensing unit includes at least a non-visible light, e.g. an IR sensing area and a color sensing area spatially arranged in a specific way that optimizes images registration, surface repartition ratio in between the 2 kind of sensing area, electrical connections and manufacturing design.

Non-visible light e.g. IR measurement can be used for depth measurement but also can provide other information which can be computed from the non-visible light e.g. IR measurements in TOF camera systems. Thus the measurements can be for example In-phase and quadrature components from which is determined a depth map A confidence map which can be derived from a depth related factor, e.g. the non-visible light or IR reflectance map)

A specific advantage in ToF sensor and camera systems of the present invention is a computation of a map of a distance dependent factor such as a reflectance map computation. This can be used to detect the presence of aliasing.

The sensor can be implemented on a silicon, an SOI substrate or using BSI.

In one aspect the present invention provides a color or multispectral image sensor device, the image sensor device comprising a pixel sensor array wherein each element of the array is associated with a single pixel sensor, and wherein each single pixel sensor comprises:

a substrate in which charge carriers are generatable in response to light incident on the substrate, first and second contact elements for electrically contacting the pixel sensor substrate, a first detection element (303, 316, 401, 501, 600) configured for detecting generated charge carriers in a first detection region, wherein the first detection element is arranged laterally and adjacent to the first contact element, a first filter element configured for letting pass light of a first non-visible wavelength range (e.g. an IR range), wherein the first filter element overlaps a portion of the substrate comprising the first and second contact elements, and a second filter element configured for letting pass light of a second wavelength range, wherein the second filter element overlaps a portion of the substrate comprising the first detection element, wherein the second wavelength range is different from the first wavelength range and is associated with a color.

The color or multispectral image sensor device can be used in a 3D camera for example.

Color refers to the related sensitive stimulus of which correspond to a color perception in the human being vision system The filter elements allow each of the first and second detection elements to receive a different wavelength range, respectively. One wavelength range is non-visible e.g. in the IR domain, and one range in the visible spectrum.

The pixel sensor may comprise:
a second detection element (314) configured for detecting generated charge carriers in a second detection region, wherein the second detection element is arranged laterally and on common first side of the first detection element and first and second contact elements corresponding to the common first side of the first and second contact elements, and
a light shielding element overlapping the second detection element.

The pixel sensor may comprise at least one charge transfer element which can transfer charges from the first and/or the second detection element to a common element, which can be a detection element or another charge storage element.

The pixel sensor may comprise:
a charge carrier diffusion contact element (320) suppliable with energy, wherein the charge carrier diffusion contact element is configured for transferring the charge carriers from the second detection element to the first detection element (e.g. by diffusion) based on an amount of the supplied energy.

The pixel sensor may comprise:
a second detection element (404, 504, 604) configured for detecting generated charge carriers in a second detection region, wherein the second detection element is arranged laterally of and between the detection element and the first contact element, wherein the first filter element overlaps the second detection element.

The pixel sensor may comprise:
a switching element connecting (414) the first and second detection elements with one another.

The pixel sensor may comprise:
a charge carrier diffusion element (614) configured for diffusively receiving detected charge carriers from the second detection element, wherein the charge carrier diffusion element is overlapped by the first filter element, and
a charge carrier diffusion contact element (605) suppliable with energy, wherein the charge carrier diffusion contact element is configured for diffusively transferring the charge carriers from the second detection element to the charge carrier diffusion element based on an amount of the supplied energy.

The pixel sensor may comprise:
another charge carrier diffusion element (501, 601) configured for receiving the detected charge carriers from the first detection element, wherein the another charge carrier diffusion is arranged laterally of and adjacent to the first detection element, and
another charge carrier diffusion contact element (506, 606) suppliable with energy, wherein the another charge carrier diffusion contact element is configured for diffusively transferring the charge carriers from the first detection element to the another charge carrier diffusion element based on an amount of the supplied energy.

The pixel sensor may further comprise:
a buffer element or read-out element (415, 513, 613) connected to the first and second detection elements and configured for selectively storing the detected charge carriers from the detection element and the detected charge carriers from the second detection element.

The pixel sensor may comprise:
another switching element (411, 511, 611) configured for connecting the first and second detection elements to an energy source configured for supplying energy to the first and second detection elements.

The pixel sensor may comprise a semiconductor based structure, wherein the first and second contact elements comprises semiconductor regions of a first conductivity type, wherein the first detection element and/or the second detection element comprise a semiconductor region of a second conductivity type.

Optionally the first detection element and/or the second detection element can be configured as a pinned photodiode.

The pixel sensor may be part of an array and hence may comprise:
  another first detection element configured for detecting generated charge carriers, wherein the another first detection element is arranged laterally and adjacent to the second contact element,
  another second filter element configured for letting pass light of another second wavelength range, wherein the another second filter element overlaps a portion of the substrate comprising the another first detection element, wherein the another second wavelength range is different from the first wavelength range and is associated with another color,
wherein the another first detection element is arranged laterally and on a common second side of the first and second contact elements.

A preferred embodiment is a color image sensor device comprising a plurality of pixel sensors, wherein each pixel sensor of the plurality of pixel sensors is associated with a single pixel of the image and comprises:
  a substrate in which charge carriers are generatable in response to the light incident on the substrate,
  first and second contact elements for electrically contacting the pixel sensor, wherein the first and second contact elements are arranged adjacent to one another,
  a first detection element configured for detecting generated charge carriers in a first detection region, wherein the first detection element is arranged laterally and adjacent to the first contact element,
  a first filter element configured for letting pass light of a first wavelength range, wherein the first filter element overlaps a portion of the substrate comprising the first and second contact elements, and
  a second filter element configured for letting pass light of a second wavelength range, wherein the second filter element overlaps a portion of the substrate comprising the first detection element, wherein the second wavelength range is different from the first wavelength range and is associated with a color,
at least one charge transfer element (320, 414, 506, 605+606) which can transfer charges from the first and/or the second detection element to a common element, which can be a detection element or another charge storage element.

The color or multispectral image sensor device may comprise or may be adapted to work with:
  a determination unit configured for determining a color and a travel distance of the light based on the detected charge carriers. Optionally, the determination unit is configured for determining the travel distance of the light based on the detected charge carriers from a single image sensor unit.

The determination unit typically has a processing unit which can be located in the substrate and/or under each pixel and that perform calculations to transform charge carriers into digital data value including
  A depth measurement
  A distance dependent factor measurement such as a reflectance measurement
  Color component data measurement
  Optionally I/Q phase maps.

The determination unit may also be a separate unit that is coupled to the sensor by a suitable communication path such as a cable or wireless connection.

The determination unit may be configured for determining the travel distance of the light based on the detected charge carriers received from multiple pixel sensors.

The determination unit is configured for determining the travel distance of the light based on the detected charge carriers detected during a single acquisition event of the image sensor device.

Alternatively, the determination unit can be configured for determining the travel distance of the light based on the detected charge carriers detected during multiple acquisition events of the image sensor device.

The 3D image sensor device can be configured optionally as a current-assisted-photonic demodulator device, a photonic mixing demodulator device, a drift-field-pixel-based demodulator device, or a depletion-region-modulation-based pixel demodulator device.

In another aspect the present invention provides a method of detecting light in a 3D image sensor device, the method comprising:
  supplying energy to first and second contact elements of a pixel sensor of the 3D image sensor device, wherein the pixel sensor is associated with a single pixel, wherein the first and second contact elements are arranged adjacent to one another,
  generating charge carriers in a substrate of the pixel sensor in response to the light incident on the substrate via first and second filters of the image sensor unit, wherein the first filter element is configured for letting pass light of a first wavelength range, wherein the first filter element overlaps a portion of the substrate comprising the first and second contact elements, wherein the second filter element is configured for letting pass light of a second wavelength range, wherein the second filter element overlaps a portion of the substrate comprising a first detection element of the image sensor unit, wherein the second wavelength range is different from the first wavelength range and is associated with a color,
  detecting generated charge carriers by the first detection element (303, 316, 401, 501, 600), and
  transferring charges to a common element, which can be a detection element or a charge storage element.

The first detection element can be arranged laterally and adjacent to the first contact element, wherein the first detection element is arranged laterally and on a common first side of the first and second contact elements.

BRIEF DESCRIPTION OF THE DRAWINGS

FIG. 1*c* shows a sensor implementation pattern where each pixel acquires a correlation C, more specifically I, Q each being a different correlation component, and a color component R, G, B either sequentially or simultaneously in time. The correlations I and Q are arranged in a pattern FIG. 1*d* shows a sensor implementation pattern where each pixel acquires a correlation C, more specifically I, Q each being a different correlation component, and a color component R, G, B either sequentially or simultaneously in time. The correlations I and Q are arranged in another pattern

The correlations C of each pixel can be the same correlation component across the pixels in the array or can be arranged according to a pattern.

Figure 2A:
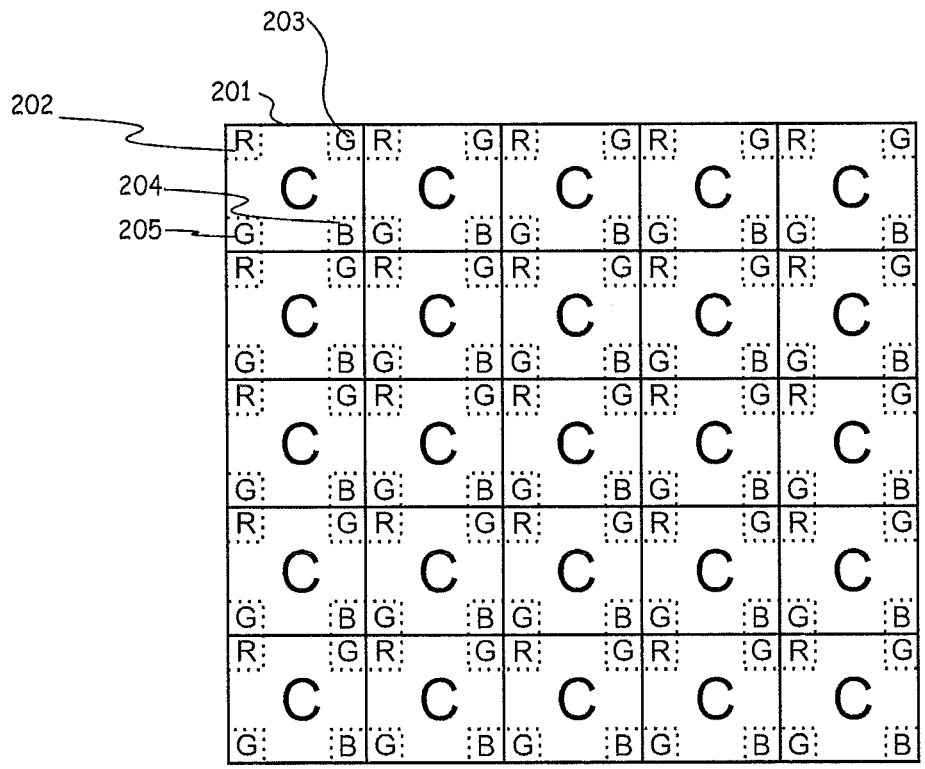
FIG. 2a shows a sensor implementation pattern where each pixel acquires a correlation C, and a set of color components R, G, B either sequentially or simultaneously in time.
Figure 2B:
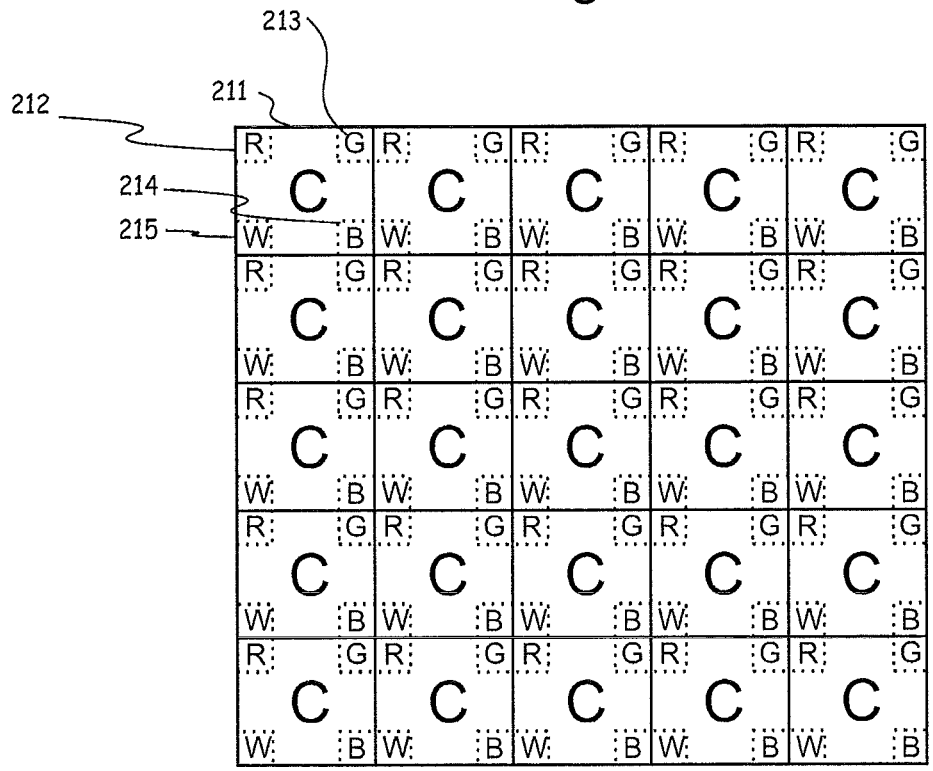

FIG. 2b shows a sensor implementation pattern where each pixel acquires a correlation C, and a set of color components R, G, B, W either sequentially or simultaneously in time.

The correlations C of each pixel can be the same correlation component across the pixels in the array or can be arranged according to a pattern.

Figure 3:
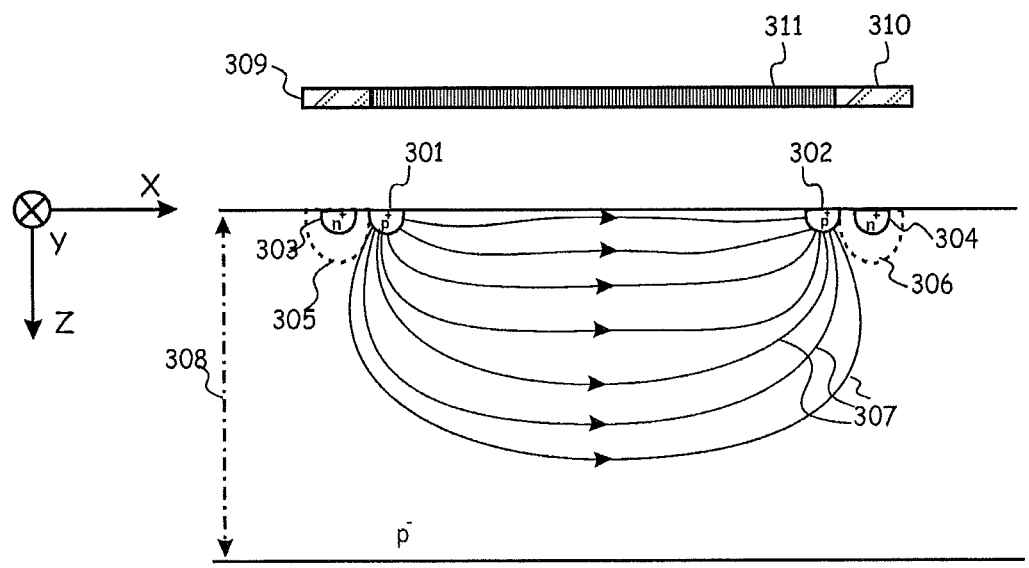

FIG. 3 shows an embodiment of the invention whereby both color and correlation components can be acquired in a single architecture.

Figure 3B:
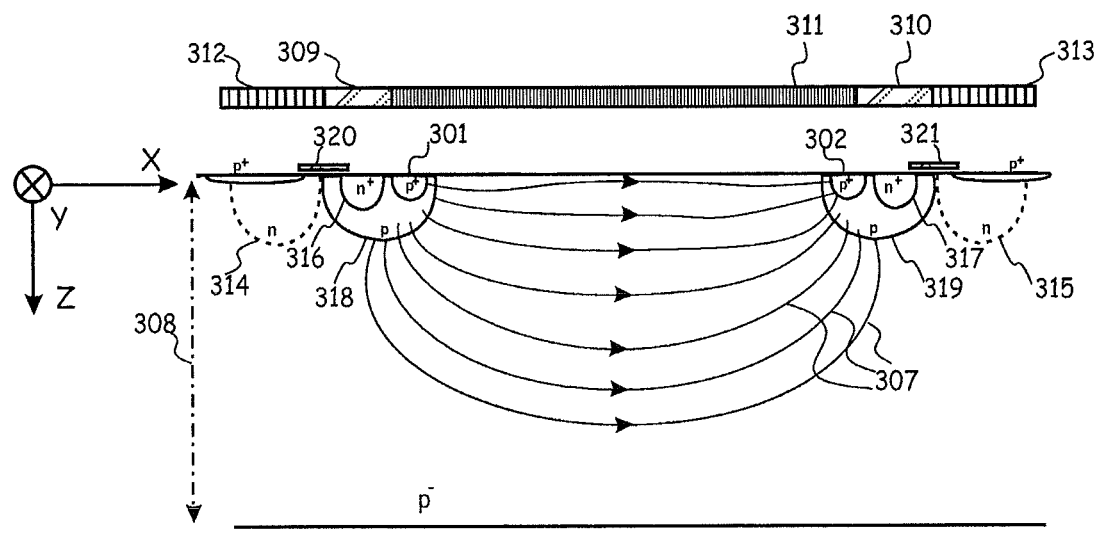

FIG. 3b shows another embodiment of the invention whereby both color and correlation components can be acquired in a single architecture.

Figure 4:
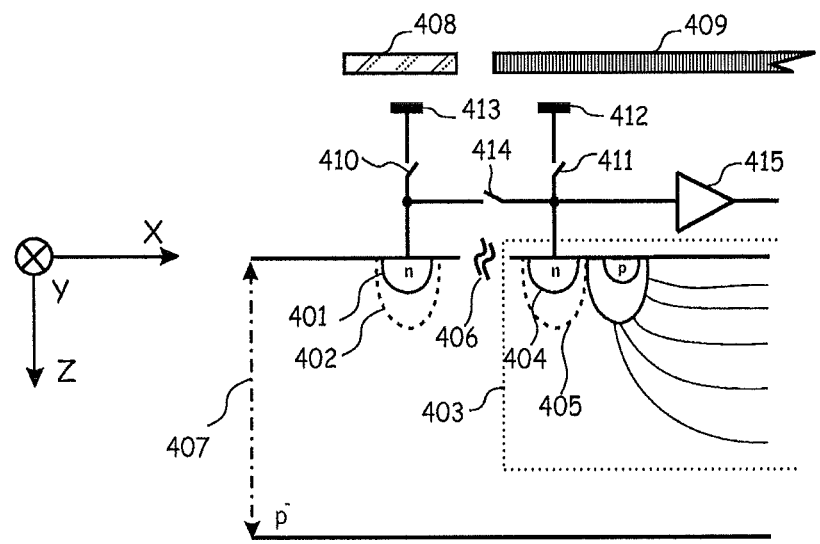

FIG. 4 shows another embodiment of the invention whereby both color and correlation components can be acquired in a single architecture.

Figure 5:
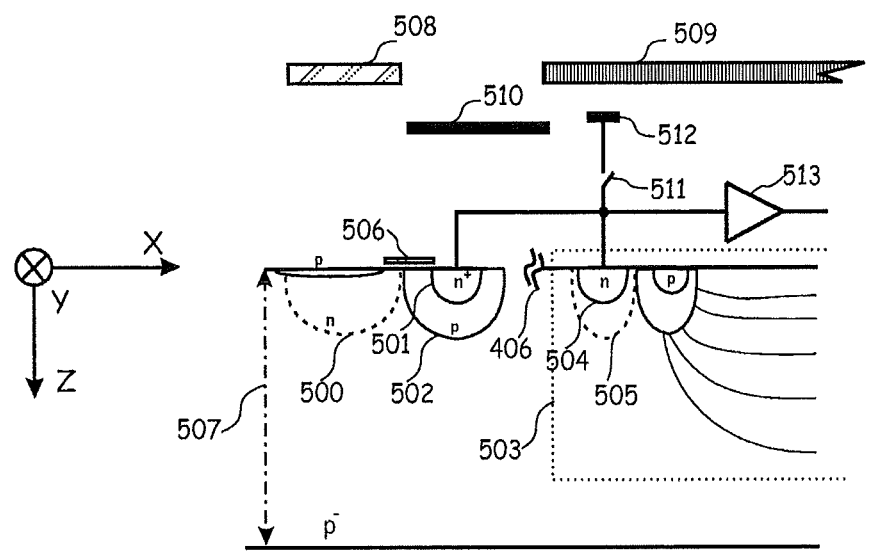

FIG. 5 shows another embodiment of the invention whereby both color and correlation components can be acquired in a single architecture.

Figure 6:
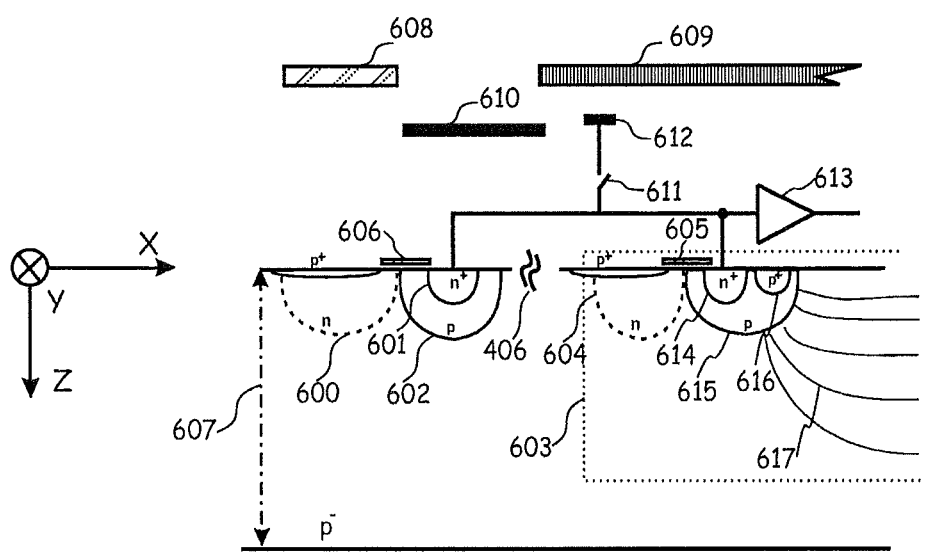

FIG. 6 shows another embodiment of the invention whereby both color and correlation components can be acquired in a single architecture.

Figure 7:
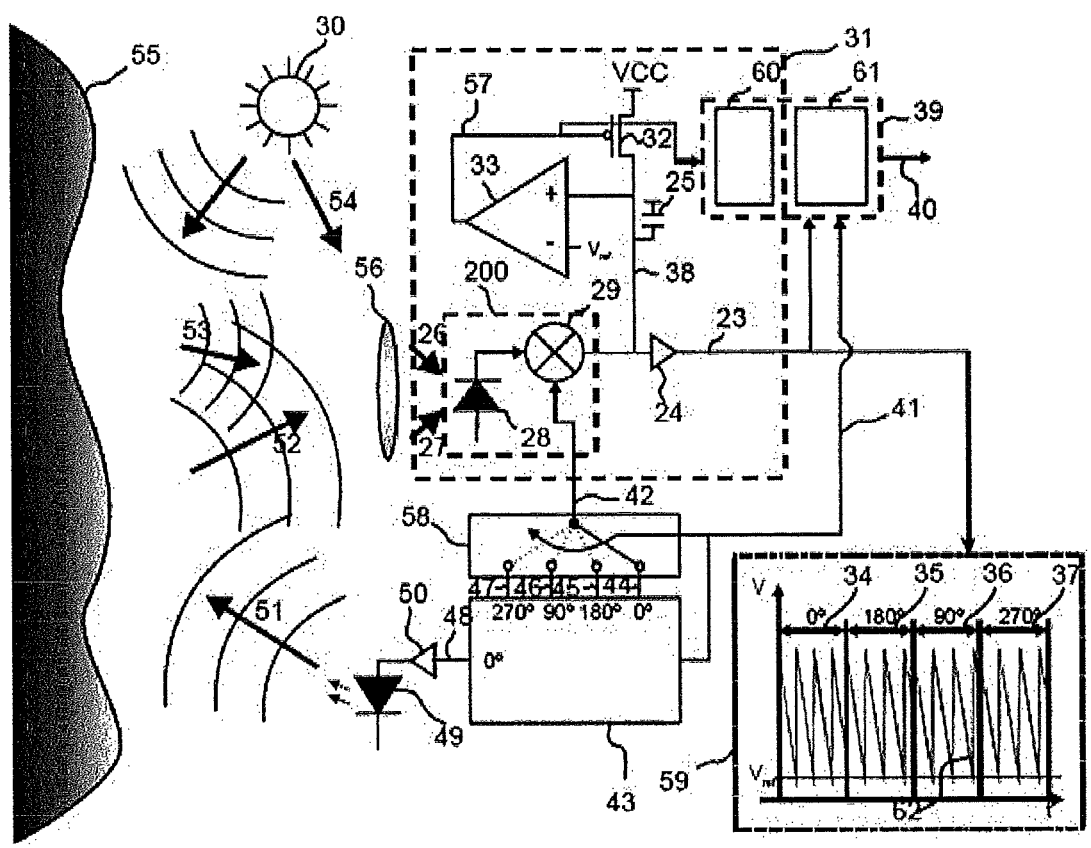

FIG. 7 shows a time-of-flight system architecture and method incorporating an embodiment of the current invention.

Figure 8:
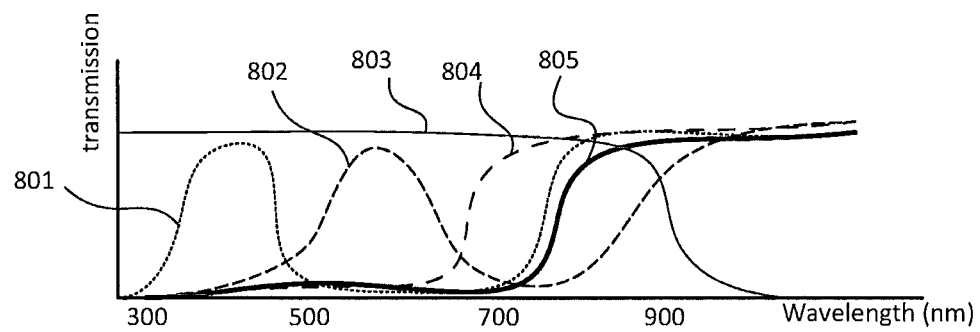

FIG. 8 shows the transmission profile of typical RGB color filters as well as the strategic combination of color filters claimed in this invention.

Figure 9:
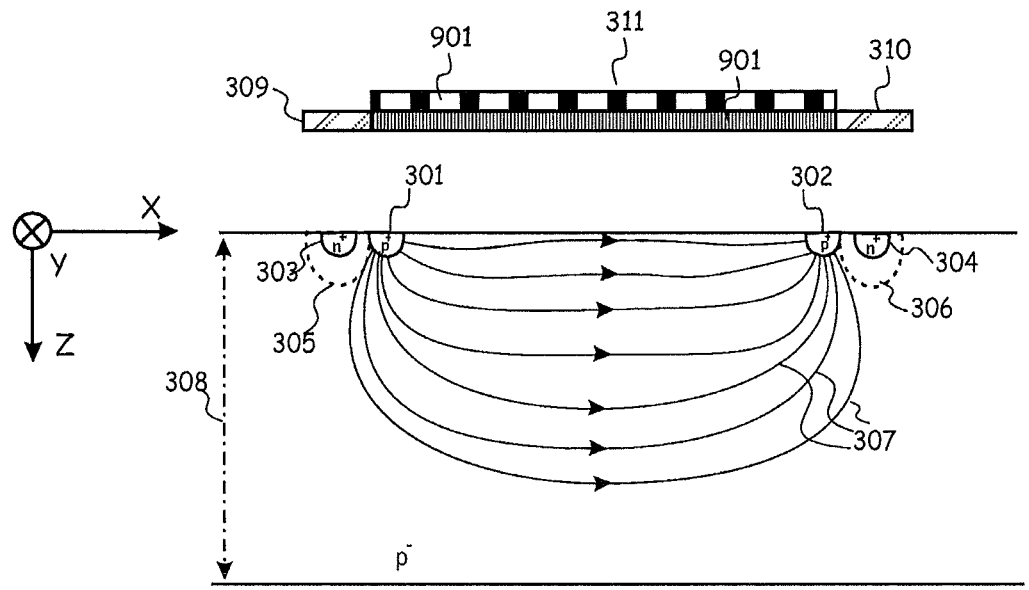

FIG. 9 shows an embodiment of the invention using a strategic stack of color filters.

DESCRIPTION OF THE ILLUSTRATIVE EMBODIMENTS

The present invention will be described with respect to particular embodiments and with reference to certain drawings but the invention is not limited thereto. The drawings described are only schematic and are non-limiting. In the drawings, the size of some of the elements may be exaggerated and not drawn on scale for illustrative purposes.

In embodiments of the present invention integration of color (such as RGB) and/or depth (Z) and/or a confidence map is described for CAPD (Current-assisted photonic demodulator) devices as examples only. These CAPD devices in some embodiments are used in electro-optical demodulating Time-of-Flight devices. The present invention is not restricted to CAPD devices and can be used with demodulating devices such as the photonic mixing device (PMD, Panasonic, Mesa), drift field pixels (Mesa), depletion-region-modulation-based pixels (Canesta) and others.

Figure 1A:
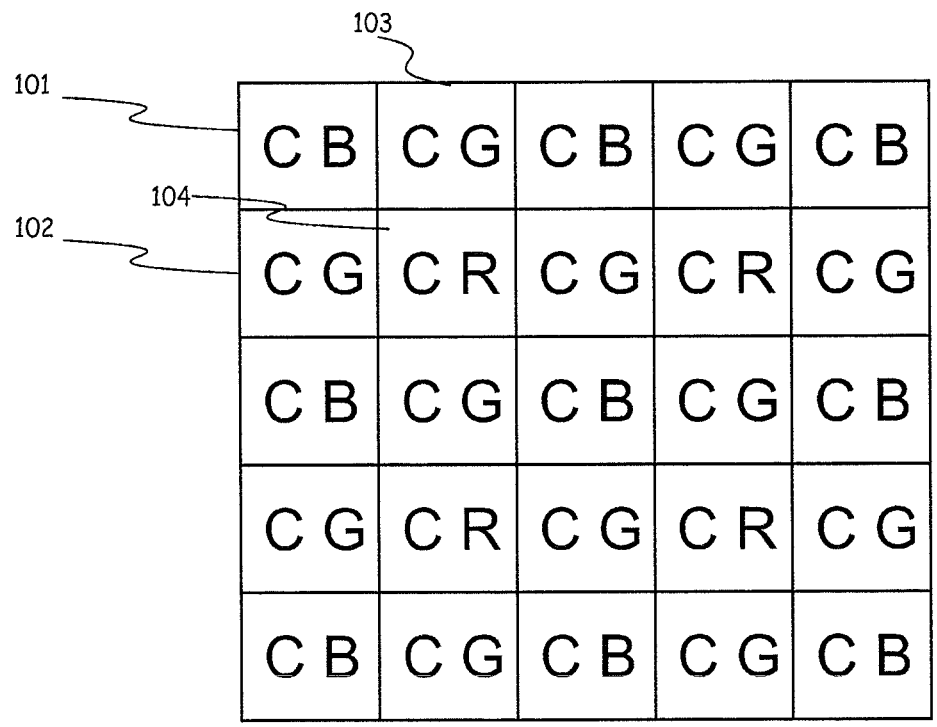
FIG. 1*a* shows a sensor implementation pattern where each pixel acquires a correlation C and a color component R, G, B either sequentially or simultaneously in time. The correlations C of each pixel can be the same correlation component across the pixels in the array or can be arranged according to a pattern.

FIG. 1a shows a first embodiment of the invention. The figure illustrates a pattern of pixels whereby individual pixels 101, 102, 103, 104 are capable of acquiring a non visible light, e.g. IR component which is at least 1 a correlation component ($C_i$) to reconstruct depth (Z) and at acquiring at least 1 color component. The non visible light, e.g. IR component can also provide a distance dependent factor such as a reflectance value of reflected non visible light, e.g. IR light from the object being viewed. Other distance dependent factors can be a speckle pattern, or a pattern that is actively projected onto the object. The distance dependent factor can be used to generate a confidence level. The color component can be for example R(ed), G(reen), B(lue), W(hite), etc. The color-pattern can be implemented according to state-of-the art patterns such as Bayer, RGBW, etc. Each pixel can be used to reconstruct depth and color offering the advantage of near-perfect registration. Pixels in an array do not necessarily acquire the same correlation component. For instance FIG. 1c shows a pattern with pixels measuring in-phase correlation component I and other pixels measuring quadrature correlation component Q. Other patterns are included within the scope of the present invention where inphase correlation I, out-phase correlation not(I), quadrature Q and inverse quadrate not(Q) are measured. Additionally, the correlation component measured can be changing in time within 1 frame or for each frame. For example acquired correlation component patterns could alternate between the pattern shown in FIG. 1c and the pattern shown in FIG. 1b.

Figure 1B:
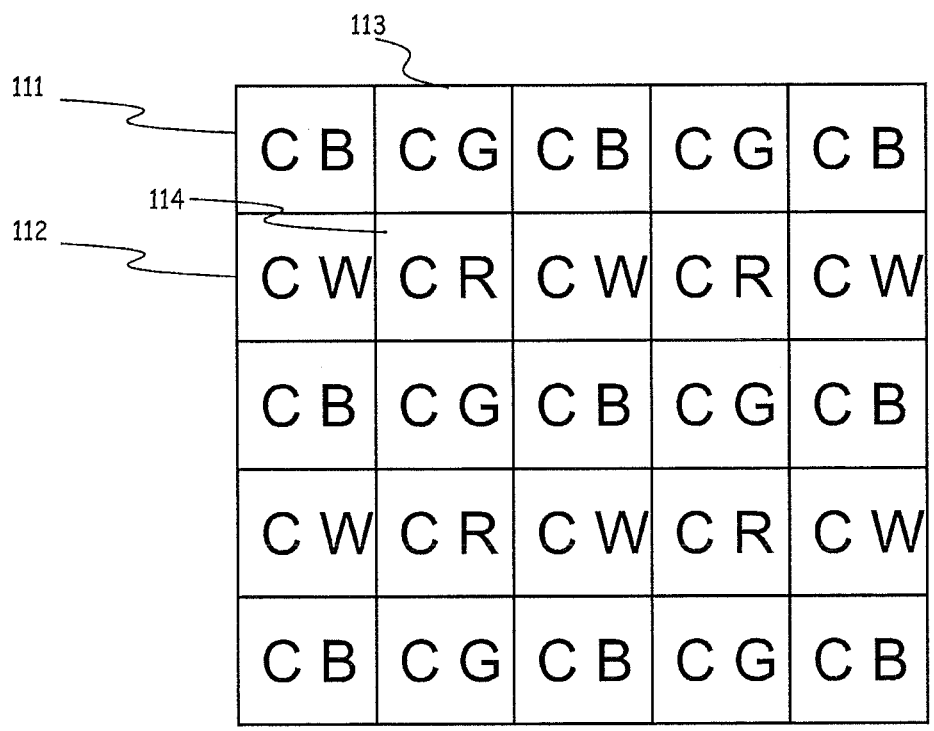
FIG. 1*b* shows a sensor implementation pattern where each pixel acquires a correlation C and a color component R, G, B or W either sequentially or simultaneously in time. The correlations C of each pixel can be the same correlation component across the pixels in the array or can be arranged according to a pattern.

FIG. 1b shows a second embodiment of the inventions where pixels are capable of acquiring at least 1 correlation component to reconstruct depth and at least 1 color component R(ed), G(reen), B(lue) or W(hite).

A number of methods can be listed to reconstruct depth using spatially distributed, temporally distributed or spatially and temporally distributed correlation components. A pixel depth (Z) can be obtained using a single pixel and a single acquisition. Each pixel thus measures in a single optical acquisition (or exposure) all correlation components needed for a depth reconstruction.

Or the pixel depth (Z) can be obtained using 2 or more pixels and a single acquisition, each pixel measuring a correlation component necessary for the depth reconstruction. Each pixel thus measures at least 1 correlation component and may interpolates the missing correlation components using neighboring pixels. Methods for checking the consistency of the correlation components can be used to avoid combining uncorrelated correlation components. One could compare the total energy of the neighbor's correlation component with the native correlation component. The neighbor can then only contribute to the interpolation of the missing correlation components if the energy is approximately equal to the native correlation component.

Or the pixel depth (Z) can be obtained using a single pixel and multiple acquisitions, each pixel measuring the correlation components necessary for the depth reconstruction spread over 2 or more optical acquisitions. The temporal spreading of the acquisition of the correlation components causes errors in dynamic scenes. Due to movements of objects temporally space correlations might not be correlated (read: measuring the information from the same object). Again, methods for checking the consistency of the correlation components can be used to avoid combining uncorrelated correlation components.

Or the pixel depth (Z) can be obtained using a combination of previous possibilities, for example using 2 or more pixels and 2 or more acquisitions. Methods for determining consistency across correlation components can be applied.

FIG. 2a shows a second embodiment of the invention. A pattern of pixels is illustrated where pixels such as pixel 201 are capable of measuring at least 1 correlation component to reconstruct depth and 3 color components R,G,B (202,203, 204,205)

FIG. 2b shows a variation of the second embodiment of the invention. A pattern of pixels is illustrated where pixels such as pixel 211 are capable of measuring at least 1 correlation component to reconstruct depth and 4 color components R,G, B,W (212,213,214,215).

FIG. 3 shows a third embodiment of the invention.

In the described embodiments of the present invention a CAPD is chosen as demodulation pixel, but the implementation can be independent of the demodulating device.

In FIG. 3 a Current-assisted photonic demodulator is shown whereby an electric field 307 is induced in a substrate 308 by a majority carrier current flowing between substrate terminals 301 and 302 or, in other words, first and second contact elements 301 and 302 (or vice versa). The substrate between the terminals 301 and 302 forms a first area sensitive to electromagnetic radiation, i.e. incident electromagnetic radiation, such as light for example, generates carriers in the substrate. The wavelength of the radiation that is effective in generation, e.g. speed of operation, depends upon the material of the substrate used as well as other factors such as temperature. Alongside substrate contacts or contact elements 301, 302 is a first and second detector 303, 304 respectively in second areas with a detection junction 305, 306 respectively. In this figure these are positioned lateral in the outer direction with respect to the respective substrate contacts, however the position of the detectors can be in any direction around the respective substrate contact. The second areas can be sensitive to visual light. By modifying the direction and/or density or amplitude of the majority carrier current in the first sensitive area (using contact elements 301 and 302) or modulating the injected majority carrier current, the detectivity of the first detectors 303 and 304 (i.e. the first detector 303 comprising the detection junction 305, and the second detector 304 comprising the detection junction 306) can be controlled. In the embodiments shown in FIG. 3, the sensor comprises p-doped regions for the contact elements and n-doped regions for the detection elements in a semiconductor based substrate. In other words, the pixel sensor comprises a semiconductor based structure, wherein the first and second contact elements comprises semiconductor regions of a first conductivity type, wherein the first detection element and/or the second detection element comprise a semiconductor region of a second conductivity type.

A CAPD can have at least 1 up to any number of demodulation nodes, a demodulation node comprising or consisting of a detector (303), a detection junction (305) and a substrate contact or contact element (301) form a demodulation node.

The first and second detectors 303 and 304 are in prior art usually covered with an opaque material such as a metal. This is because the electrons which are generated by photons in the vicinity of the detection junction can no longer be demodulated and do not contribute to the measured signal which for pulsed non-visible, e.g. IR light measurements comprises the delay, phase and amount of energy of which is used to determine IQ quadratures and/or a reflectance measurement and or depth measurement. This area is however quite small. For a pixel of 10 micron by 10 micron a detection node of only 1 micron by 1 micorn can be used, as the second optically sensitive area can be much larger than the detection node itself. An area ratio 1:100 can be achieved in a straightforward way.

In embodiments of the present invention, at least one detection and/or conversion node (303, 304) is/are covered with a first filter 309 and 310 which transmits light of one frequency or of a frequency range that may correspond to a color perception of a human being visual system, e.g. in the optical visual range, while the majority or all of the first sensitive area is covered with a second (e.g. NIR) filter 311 blocking the visual light and transmitting electromagnetic radiation of a second frequency or frequency range, e.g. a non-visible light such as a NIR light. This filter can be, but is not limited to, a low-pass filter or a bandpass-filter passing the wavelength or wavelength range at which the Time-of-Flight measurements operate. The second filter 311 may also be a stack of color filters (901) as shown in FIG. 9, whereby the required spectral response is created by overlapping 2 or more color filters. FIG. 8 shows a collection of typical filter responses to create blue (801), green (802) and red (804) responses. The filter 311 in FIG. 3 can for example be created by overlap of blue (801) and red (804) creating filter response (805). Overlap of blue and red is preferred. FIG. 9 shows an embodiment of the invention using strategic overlap of color filters (901). To create a bandpass-effect, an additional simple shortpass filter (803) can be deposited either on the complete optical area of the sensor device, either on a package level. This filter stack can be applied to any of the embodiments in this invention. In other words, the filter element may be a stack of filter elements, each filter element of the stack being configured for letting pass light of a certain wavelength range in order to obtain a predetermined filter response. The filters 303, 304 can be but are not necessarily equal in spectral response. Thus embodiments of the present invention disclose a first filter element configured for letting pass light of a first wavelength range, wherein the first filter element overlaps a portion of the substrate comprising the first and second contact elements and includes the first sensitive area, and a second filter element configured for letting pass light of a second wavelength range, wherein the second filter element overlaps a portion of the substrate comprising a second sensitive area and the second detection element, wherein the second wavelength range is different from the first wavelength range comprised in the visible spectrum of the Human being Visual System, and more especially corresponding to a color perception of the said HVS.

In other words, in the embodiment illustrated in FIG. 3, the region between and including the contact elements (301) and (302) may be seen as the first detection region. The generated charges in this first detection region are then detected by the first detection elements (303) and (304). The region defined by the detection junction (305) or (306) may be seen as the second detection region. The generated charges in this second detection region may be detected by second detection elements (303) and (304) respectively, which are, in this embodiment, the same as the first detection elements (303) and (304).

The device can acquire both color and correlation information time sequentially or simultaneously. The correlation information can be non-visible data light such as IR related data, including correlation information and/or reflectance measurements (i.e. the amount of energy of the received pulse). This can be used to generate a confidence level.

Simultaneously is preferred. The color information will be a DC component superimposed on the correlation component. If no majority carrier current is injected, the NIR-light-generated minority carriers in the first sensitive area of the bulk will not see an electric field nor a detection junction, and the majority of these carriers will recombine without being detected. In this mode, the pixel is only detecting the color information which is directly impinging on the first and second detectors 303 and 304 and the second sensitive area.

FIG. 3b illustrates another embodiment of the invention whereby the detectors of the CAPD are implemented as pinned photodiodes 314, 315 with associated second sensitive areas. This gives the advantage that the correlation components can potentially be acquired without the addition of reset noise. For each of the first and second detectors including the photodiodes 314, 315, respectively, a floating diffusion 316, 317 is respectively implemented in the neighboring p-well 318, 319 to provide the second sensitive areas. One can implement the floating diffusion region outside a pwell, but electrons intended to be detected by the pinned photodiode might end up detected by the floating diffusion. It is thus preferred to implement the floating diffusion in a p-well region. The neighboring p-wells 318, 319 correspond respectively to the substrate contacts 301, 302. These substrate contacts are used to control the detectivity of the pinned photodiodes modulating and/or alternating the majority carrier current injected in the substrate between the substrate contacts 301, 302. After detection the charges accumulated in the pinned photodiodes 314, 315 can be transferred to the floating diffusion 316, 317 using transfer gate., 321 respectively. In other words, transfer gates 320 and 321 may be considered as charge transfer elements transferring charges from detection elements to a common element, which, on its turn, may also be a detection element or any other charge storage element. The transfer of the charge carriers may further be done by diffusion. Embodiments of the present invention disclose transferring these charges to a common element, which can be a detection element or a charge storage element.

The control of the detectivity of the photodiodes 314, 315 can also be achieved by modulating the p-type pinning layer on the surface of the photodiodes. By laterally extending the pinning layer with respect to the photodiode edge, the pinning layer has an interface with the substrate 308 or thus a substrate contact and can be used to inject a modulated majority carrier current to control the detectivity of the associated photodiode.

The color information is acquired in the floating diffusion 316, 317 and can be read before transfer of the charges in the photodiodes 314, 315. The floating diffusion 316, 317 thus serves as conversion node for the correlation component information, as detection node for the color information, and as conversion node for color information. Color filters 309, 310 cover the floating diffusions 316, 317 respectively while an NIR filter 311 spectrally passing the operating wavelength of the Time-of-Flight system covers the first sensitive are between the contacts 301 and 302. The detectors 314, 315 are preferably covered with an opaque material as light shielding element such as a metal shield (312) to reduce direct exposure of these detectors and thus to optimize the contrast of the demodulation. The advantage is that the color information is now detected on a different node and thus not reduces the SNR of the measured correlation component.

In other words, in the embodiment as illustrated in FIG. 3b, the first detection element is the pinned photo diode (314) and/or (315) for detection the charges generated in the first detection region between and including the first and second contact elements (301) and (302). The floating diffusions (316) and/or (317) may then be seen as the second detection elements for charges generated by radiation that passed through the second filter element (309) and/or (310).

FIG. 4 illustrates another embodiment of the invention. A demodulation node 404, 405 of a CAPD 403 is shown. The detector 404 is electrically connected to a buffer or read-out element 415 and can be reset using switch 411 to a voltage 412. The CAPD, i.e. the first sensitive area is covered with a NIR-pass filter 409 passing the operating wavelength of the Time-of-Flight system. The detector 404 itself can be optionally covered with a metal shield. A detector 401 with detection junction 402 is implemented in the pixel as well. Detector 401 is covered with a color filter 408 and is associated with a second sensitive area. The location of the detector 401 in the pixel with respect to the CAPD can be chosen freely. Optionally, the detector 401 can even be located inside of the pixel area used by the CAPD 403. Detector 401 can optionally be reset to a voltage 413 using switch 410. The detector 401 can also be reset through switches 414 and 411, thus switch 410 and 413 are not necessary in some operations. A switch 414 can connect the detector 401 to the buffer for read-out. In other words, the switch 414 may be seen as a transfer element that transfers charges from a detection element to a common element. The read-out element 415 may be connected to the first and/or second storage or detection element and configured for amplifying or buffering or copying non-destructively the signal from the first and/or second storage or detection element. Using this topology, both color and correlation information can be acquired simultaneously without loss of SNR for the correlation information. Additionally, no pinned-photodiodes are required increasing the possible processes for implementation (pinned photodiodes are typically only available in CMOS Image Sensor (CIS) processes. The downside is that both the color measurement as the correlation measurement will suffer from reset noise—reducing low-light performance. However, depending on the application low-light performance is not required.

In other words, in the embodiment illustrated in FIG. 4, the detector (404) may be seen as the first detection element and the first sensitive area as the first detection region covered by the first filter element (409). The detector (401) may then be seen as the second detection element and the second sensitive area as the second detection region covered by the second filter element (408).

FIG. 5 illustrates another embodiment of the invention. The pixel includes an NW filter 509 above the first sensitive area between the substrate contacts of the CAPD 503 of which one demodulation node is shown. A first detector 504 can be optionally covered with a metal shield. The color component is now detected using a pinned photodiode 500 with an associated second sensitive area and color filter 508. Opaque material such as a metal layer 510 can be used to shield. After exposure the charges accumulated in the pinned photodiode 500 are transferred using transfer gate 506 to a floating diffusion 501 preferably located in a pwell 502. In other words, the floating diffusion 501 may be seen as a charge storage element and transfer gate 506 as a charge transfer element to move charges from the detection element 500 to the charge storage element. The transfer element 506 will transfer the charges by supplying it with an amount of energy. The floating diffusion is electrically connected to the buffer or read-out element 513 and a CAPD detector 504. The floating diffusion 501 and detector 504 are reset to a voltage 512 through the switch 511. The location of the color-detection component with respect to the CAPD in the pixel can be freely chosen.

A typical acquisition would go like this: Switch 511 resets the voltage on floating diffusion 501 and detector 504, while the pinned photodiode well 500 is depleted through transfer gate 506.

The transfer gate 506 and switch 511 are then opened and the acquisition can start for both the color component using photodiode 500 and correlation component using the demodulating device 503. At the end of the exposure the voltage on detector 504 is read through buffer or read-out element 513. After this the voltage on 504, and this also the voltage on 501, is reset to 512. This reset voltage is measured through buffer 513. A person skilled in the arts can now remove the 1/f and a big part of the thermal noise of the buffer 513 from the correlation component using the measured reset voltage. Now, the transfer gate transfers the charges in the pinned-photodiode well 500 to the floating diffusion 501. Embodiments of the present invention disclose transferring charges to a common element, which can be a detection element or a charge storage element.

The color information can now be read using buffer 513. By subtraction of the measured reset voltage from this measured color information, 1/f noise is removed, as well as a big part of the thermal noise and also the reset noise from the color measurement. The structure in FIG. 5 offers simultaneous acquisition of color component and correlation component with removal of 1/f and thermal noise of the buffer for the correlation component and removal of 1/f noise and thermal noise of the buffer 513 and reset noise from the color component. In this topology the exposures of the color component and correlation component are not necessarily the same. The correlation component needs to be read prior to reading the color component if one does not want to use the correlation component information, since the detection node to which the detector 504 is attached also acts as conversion node by means of floating diffusion 501. However, one can read the correlation component without reading the color component. The exposure of the color component can continue even while the correlation component experiences multiple exposures and read-outs.

In other words, in the embodiment illustrated in FIG. 5, the detector (504) may be seen as the first detection element and the first sensitive area as the first detection region covered by the first filter element (509). The pinned photodiode (500) may then be seen as the second detection element and the second sensitive area as the second detection region covered by the second filter element (508).

FIG. 6 illustrates a further embodiment of the invention where both detection of the color component and detector of the correlation component are performed with a pinned-photodiode structure 600 and 604 respectively. A floating diffusion 601 is preferably implemented in a pwell 602. After exposure the charges accumulated in the nwell 600 are transferred using transfer gate 606 to the floating diffusion 601 which is electrically connected to the buffer or read-out element 613. Embodiments of the present invention disclose transferring charges to a common element, which can be a detection element or a charge storage element. In other words, the floating diffusion 601 may be seen as a charge storage element configured for receiving detected charge carriers from the detection element 604 and the transfer gate 606 as a charge transfer element to move charges from the detection element 600 to the charge storage element 601. The transfer element will transfer the charges by supplying it with an amount of energy. The detector 600 acquires the color component and is covered with a color filter 608 which allows light through the second sensitive area. The floating diffusion 601 is preferably but not necessarily covered by an opaque material such as a metal shield 610.

A pinned photodiode 604 acts as detector for a demodulation node formed by detector 604 and substrate contact 616, 615 of the demodulating device 603, device 603 being covered with a filter 609 passing the operational wavelength of the Time-of-Flight function to the first sensitive area. The detector region 604 can be covered with an opaque material such as a metal to minimize direct exposure of the detector, optimizing the modulation contrast. A floating diffusion 614 is implemented in the pwell 615 which can be part of the substrate contact 616, 615. This substrate contact injects the majority carrier current used to create the functional demodulating electric field 617 in the substrate 607. A transfer gate 605 is used to transfer the accumulated charges in the nwell 604 after exposure to the floating diffusion 614. The floating diffusion 614 is electrically connected to the color floating diffusion 601 and together act as the conversion node for both color component and correlation component. The floating diffusion 614 and 601 can thus be in a different location of the pixel but are electrically connected. Embodiments of the present invention disclose transferring charges to a common element, which can be a detection element or a charge storage element.

A typical acquisition of color and correlation component using the embodiment described in FIG. 6 would go as follows: the voltage on FD 614 and FD 601 is reset to the potential 612 by means of reset switch 611. Simultaneously the transfer gates 606 and 605 fully deplete the nwells of pinned photodiodes 600 and 604, meaning that no charges remain in nwells 600 and 604. After this the transfer gates 606 and 605 and the reset switch 611 are opened. The exposure to measure color and correlation components is started. At the end of the exposure, the floating diffusions 614 and 601 are reset using switch 611. The reset is released and the reset voltage is measured through buffer 613. After this either the detected color component charge in nwell 600 or the detected correlation component charge in nwell 604 is transferred to FD 601, FD 614 respectively by means of transfer gate 606, 605 respectively, after which the color or correlation component respectively is measured through buffer 613. By subtracting the measured reset voltage the color or correlation component is measured with reduced noise from the buffer 613 and without reset noise. After this the cycle can be repeated to read out the remaining information component from the other pinned photodiode.

It is to be noted that this architecture allows independent exposure times for the color and correlation component. Using this architecture the correlation component can be accumulated and read multiple times while the color component continues to accumulate during a longer exposure, or vice-versa.

This decoupling of exposure times is beneficial for the optimization of both types of data sets: correlation components for depth reconstruction being one dataset, while the at least one color component forms another. The requirements in terms of exposure time, dynamic range in the scene and framerate can be quite different.

In other words, in the embodiment illustrated in FIG. 6, the pinned photodiode and thus detector (604) may be seen as the first detection element and the first sensitive area as the first detection region covered by the first filter element (609). The pinned photodiode and thus detector (600) may then be seen as the second detection element and the second sensitive area as the second detection region covered by the second filter element (608).

FIG. 7 shows an embodiment of a range finding system or ToF camera according to an embodiment of the present invention which includes one of the pixel sensors described above. The range finding system comprises a light source 49 for emitting light 51, especially light having an IR component onto a scene 55, preferably focussed onto an area of interest, where the light is reflected. The range finding system further comprises at least one pixel 31 for receiving reflected light. Pixel 31 can be any one of the pixels described above. These pixels can capture a color image (RGB) or color of the object of interest and depth or Z information as described above. The Z information can be obtained by use of the ToF principle or thus travel distance of the light and IR light or include an IR component in the reflected light. Embodiments of the present invention provide one single sensor which has the capability to obtain a colored image, a depth map, a reflectance map or illumination map. In addition a confidence map can be obtained. From the Z information a distance map can be obtained and a color image can be generated by the pixels using conventional means. In order for the light source 49 to emit modulated light, a signal generator 43 is provided. The signal generator 43 generates a first clock signal or modulation signal on node 48 that is preferably permanently oscillating at a predetermined frequency, e.g. at about 10 MHz. This signal generator 43 preferably also generates a number of other clock signals such as second to fifth clock signals which are delivered onto nodes 44, 45, 46, 47, respectively, having a 0°, 180°, 90° and 270° phase relation with the first clock signal on node 48. A person skilled in the art can also consider using other or more clock phases in the operation scheme, more clock phases leading towards better measurement precision in exchange for a longer measurement time. Alternatively, instead of modulating by means of phases of a clock signal, a person skilled in the art can also consider transmitting a pseudo-random bit stream and mixing with a set of delayed and/or inverted same pseudo random bit streams. The use of pseudo-random bit streams, sometimes referred to as pseudo-noise is known in literature by a person skilled in the art. In that case, instead of the first and second clock signals it is advised to use a pseudo-random pattern, instead of the third clock signal use the same pseudo-random pattern but bitwise inverted and instead of the fourth clock signal, the same pseudo random pattern but delayed by a bit period and instead of the fifth clock signal, the same pseudo-random pattern but inverted and delayed by a bit period.

The signal generator 43 also generates a control signal 41 that is determining for a modulation signal alteration means to change the modulation signal, e.g. a control signal 41 that is determining for a selector 58 to select between the various clock signals, e.g. second to fifth clock signals, i.e. between the different phases of the clock signal. Selector 58 is switching sequentially between these four phases connecting the input node 42 of a mixer 29 of a detector and mixer stage 200 with the second to fifth clock signals on nodes 44, 45, 46 and 47 sequentially. At each of these positions selector 58 can stay connected for a relaxation period of e.g. about 1 ms.

Buffer 50 drives the light source 49 that emits its light 51 including an IR component onto the scene 55, preferably focused on the area of interest. Part of this light will be reflected, thus generating reflected light 52. Reflected light 52 can include an IR component and a colored light component. This reflected light 52 then arrives on an optical focussing system such as a lens 56, through which it is imaged or focussed on a detector 28 inside pixel 31, where the incident fraction is called the reflected modulated light (ML) 27 and includes an IR component.

Indirect light 53 and direct light 54, both originating from secondary light sources 30 not intended for the TOF measurement, will also be present in the scene, impinge on the optical focussing system 56 and thus be focused on the detector 28. The part of this light entering detector 28 will be called background light (BL) 26. Light sources 30 generating BL include incandescent lamps, TL-lamps, sunlight, daylight, or whatever other light that is present on the scene and does not emanate from the light source 49 for TOF measurement:

ML 27 including an IR component and BL 26 impinge onto the photodetector 28, and generate, for the IR component, an ML-current. Also a BL-current is induced, both the ML and BL currents being photo-induced current responses to the impinging BL 26 and ML 27. Detector 28 outputs these currents to a subsequent mixing means, e.g. mixer 29, for mixing the current responses to the impinging BL 26 and ML 27 with the phase-shifted clock signal on input node 42. As already stated earlier, this BL 26 can induce a BL-current of up to 6 orders of magnitude higher than the ML-current induced by the ML 27 received for TOF measurements.

Detector 28 and mixer 29, forming detector and mixer stage 200, can as well be implemented as one single device, where the photo-generated charges are mixed generating the mixing product current at once.

The detector and mixer stage 200 will generate the mixing products of the current responses to the impinging BL 26 and ML 27 with phase-shifted clock signals, and these signals are being integrated on node 38 by means of an integrator, for example implemented with a capacitor 25, which preferably is kept small, e.g. the parasitic capacitance of the surrounding transistors. During integration, an automatic reset of the mixer output signal on the integrator node 38 is performed.

This may for example be implemented by a comparator 33 triggering a reset switch, e.g. reset transistor 32, so that the mixer output signal on node 38 is automatically reset whenever it reaches a reference value Vref, thus avoiding saturation.

In alternative embodiments, not illustrated in the drawings, the automatic reset of the mixer output signal on the integrator node 38 can be implemented in several other ways. One of them is triggering a charge pump, instead of the reset switch 32, to add a fixed amount of charges to capacitor 25 yielding a better noise performance at the cost of some more complexity.

The mixing products forming the mixer output signal are available in a sequential form synchronised with the modulation signal alteration means, in the example illustrated selector 58, at integrator node 38. An output driver 24, e.g. a buffer, provides a voltage gain substantially 1 and current amplification so as to provide a stronger output signal at output node 23. In graph 59 an example of an output signal at node 23 is represented. Curve 62 corresponds to the voltage evolution versus time of the output signal at output node 23. It is supposed that the average BL contribution 26 and average ML 27 is constant during acquisition.

During a first relaxation period 34, selector 58 is connected to node 44. The mixing of the incoming signal from the detector 28 (responses to BL 26 and ML 27) is done with the second clock signal at node 44, which is a 0° shifted version of the first clock signal driving the light source 49. The mixer output signal at node 38 will thus be determined by a BL component and a 0° mixed ML output. The next relaxation period 35 starts by connection of input node 42 to node 45 through selector 58. From then on, the mixer 29 is driven 180° out of phase. Therefore its output will be determined by the same BL component and a 180° mixed output. The phases 90° and 270° are subsequently treated similarly in subsequent relaxation periods 36 and 37 respectively.

Time-of-flight data reconstruction block 39 uses the output signal at output node 23 to measure, e.g. by taking samples, the end values of each relaxation period 34, 35, 36, 37, also called phase interval. The ToF data is obtained from the IR component of the reflected light. This data is grouped to TOF pairs, e.g. (0°, 180°) and (90°, 270°). TOF data reconstruction block 39 serves to translate the bare pixel signals to useful time-of-flight output 40.

Sometimes a transformation step and/or validation step is included. In embodiments of the present invention this reconstruction block may be built up of two possible parts: a relative position memory 60 which in embodiments of the present invention may be an in-pixel relative position memory 60 for the IR component and a processing block 61 which in embodiments of the present invention may be an off-pixel signal processing block 61. The signal processing block 61 may be realised in any suitable way, for example in-pixel, on-chip, in a microprocessor, a DSP, in an FPGA, at software level and can even be distributed and spread over various levels, e.g. partly on-chip, partly in an FPGA and partly at software level on a PC, depending on the application.

Measuring the TOF data sequentially is needed for signals within one TOF pair. When using more than one TOF pair these different TOF pairs can be measured in parallel using two pixels 31, in some cases even sharing partly mixer 29, detector 28 or both. In the embodiment shown in FIG. 7, the TOF pair emanating from signals 46 and 47 can for example be implemented in such an extra circuit, allowing parallel acquisition of both TOF pairs and gaining more robustness to fast background and modulated light changes, at the cost of extra silicon area. Doubling part or whole of the embodiment to acquire other TOF data in parallel might further also require the subsequent post processing blocks to compensate for the mismatch that can exist between the different circuits.

The device described above can capture a color image (RGB) and depth or Z information in the form of a distance map in one single sensor. Such a sensor can be used in a Time-of-flight camera. The combination of IR depth data and the associated color image can be used to generate a "Confidence Map". A confidence map is the Infra-Red illumination map of the scene (i.e. a kind of grey-map).

There is therefore 3 functionalities in one single imager/sensor according to embodiments of the present invention:

The "confidence map" is an image that is computed by integrating all together the measured phase maps (I & Q), said phase maps being used to compute the depth map according to the ToF principle.

The confidence map is thus an image that represents basically the IR illumination of the scene by the camera modulated light source, e.g. LED array over the entire integration periods.

Determining the color and travel distance of the light based on the detected charge carriers or determining the depth map, reflectance map, confidence or illumination map may be done by a determination unit.

For each pixel, the IR value extracted from that confidence map is used as an indicator of the depth estimation quality since a low "grey level" (i.e. a low IR illumination) is less reliable (since more noisy) than a high "grey level" (into which noise as a minor impact).

The described sensor architecture is the same as described for any of the embodiments of the sensor described above, i.e. a Color and IR detection area within each individual single pixel.

The camera comprises:
a color computation unit connected to a first set of Detection elements, the output of which is a color value expressed, for example as a standard RGB value (or any kind of other color coordinate system)
an IR computation unit the output of which is:
  a depth measurement
  a scene illumination measurement (namely the confidence map)

The computation unit can be the unit 61 of FIG. 7 for example.

The invention claimed is:

1. A color or multispectral image sensor device, the image sensor device comprising a pixel sensor associated with a single pixel of an image, wherein the pixel sensor comprises:
a substrate in which charge carriers are generatable in response to light incident on the substrate,
first (301, 616) and second (302) contact elements formed in the substrate for electrically contacting the pixel sensor,
characterized in that the first and second contact elements are arranged adjacent to one another, and further comprising:
a first detection element (303, 304, 314, 315, 404, 504, 604) formed in the substrate and configured for detecting generated charge carriers in a first detection region,
a means for controlling the detectivity of the first detection region (301)
a second detection element (303, 304, 316, 401, 500, 600) formed in the substrate and configured for detecting generated charge carriers in a second detection region,
a first filter element (311, 409, 509, 609) configured for letting pass light of a first wavelength range, wherein the first filter element overlaps a portion of the substrate comprising the first and second contact elements and also comprising the area sensitive to light between the first and second contact elements
a second filter element (309, 310, 408, 508, 608) configured for letting pass light of a second wavelength range, wherein the second filter element overlaps a portion of the substrate covering the second detection element and does not overlap the first filter element, wherein the second wavelength range is different from the first wavelength range,
wherein the first and second detection elements (303, 304, 316, 314, 315, 401, 404, 504, 600, 604) are laterally placed alongside the first and second contact elements (301, 302, 616), such that the first and second contact elements (301, 302, 616) can control the detectivity of the first and second detection elements (303, 304, 316, 314, 315, 401, 404, 504, 600, 604), and are not placed in between the contact elements;
wherein the pixel sensor comprises a semiconductor based structure,
wherein the substrate, the first and second contact elements comprise semiconductor regions of a first conductivity type, wherein the first detection element and the second detection element comprise a semiconductor region of a second conductivity type.

2. A color or multispectral image sensor device according to claim 1, wherein the means for controlling the detectivity of the first detection region is configured for modulating an injected majority carrier current through the contact elements.

3. A color or multispectral image sensor device according to claim 1, wherein the pixel sensor further comprises:
at least one charge transfer element (320, 414, 506, 605, 606) which can transfer charges from the first and/or the second detection element to a common element, which can be a detection element or any other charge storage element.

4. A color or multispectral image sensor device according to claim 1, wherein the first detection element is arranged to be also the second detection element.

5. The color or multispectral image sensor device according to claim 3, wherein the charge transfer element (320, 321) transfers charges from the first detection element to the second detection element or from the second detection element to the first detection element; and wherein a light shielding element (312) overlaps the second detection element.

6. The color or multispectral image sensor device according to claim 3, wherein the charge transfer element (320) is suppliable with energy; and wherein the charge carrier element is configured for transferring the charge carriers by diffusion from the second detection element to the first detection element based on an amount of the supplied energy.

7. The color or multispectral image sensor device according to claim 1, wherein the pixel sensor further comprises:
a switching element configured for connecting (414) the first and second detection elements with one another.

8. The color or multispectral image sensor device according to claim 1, wherein the pixel sensor further comprises:
- a charge carrier storage element (614) configured for receiving detected charge carriers from the first detection element (604), and
- a charge carrier transfer element (605) suppliable with energy, wherein the charge carrier transfer element is configured for transferring the charge carriers from the first detection element to the charge carrier storage element based on an amount of the supplied energy.

9. The color or multispectral image sensor device according to claim 1, wherein the pixel sensor further comprises:
- a second charge carrier storage element (501, 601) configured for receiving the detected charge carriers from the second detection element (500, 600), wherein the second charge carrier storage element is arranged laterally in proximity of the second detection element, and
- a second charge carrier transfer element (506, 606) suppliable with energy, wherein the second charge carrier transfer element is configured for transferring the charge carriers from the second detection element to the another charge carrier storage element based on an amount of the supplied energy.

10. The color or multispectral image sensor device according to claim 1, wherein the pixel sensor further comprises:
- a read-out element (415, 513, 613) connected to the first and/or second storage or detection element and configured for amplifying or buffering or copying non-destructively the signal on the first and/or second storage or detection element.

11. The color or multispectral image sensor device according to claim 1, wherein the pixel sensor further comprises:
- a second switching element (411, 511, 611) configured for connecting the first and second detection elements to an energy source configured for supplying energy to the first and second detection elements.

12. The color or multispectral image sensor device according to claim 1, wherein the first detection region together with the first detection element(s) and detectivity control means is configured as a current-assisted-photonic demodulator device, a photonic mixing demodulator device, a drift-field-pixel-based demodulator device, or a depletion-region-modulation-based pixel demodulator device.

13. The color or multispectral image sensor device according to claim 1, wherein the first filter element is a stack of filter elements, each filter element of the stack being configured for letting pass light of a certain wavelength range.

* * * * *